United States Patent [19]

Khounsary

[11] Patent Number: 5,287,395
[45] Date of Patent: Feb. 15, 1994

[54] INCLINED MONOCHROMATOR FOR HIGH HEAT-LOAD SYNCHROTRON X-RAY RADIATION

[75] Inventor: Ali M. Khounsary, Lisle, Ill.

[73] Assignee: The United States of America as represented by the United States Department of Energy, Washington, D.C.

[21] Appl. No.: 909,323

[22] Filed: Jul. 6, 1992

[51] Int. Cl.$^5$ .............................................. G21K 7/00
[52] U.S. Cl. ........................................ 378/85; 378/73; 378/70
[58] Field of Search .................... 378/85, 84, 73, 145, 378/70, 71

[56] References Cited

U.S. PATENT DOCUMENTS 5,016,265  4/1991  Hoover ................................ 378/43

OTHER PUBLICATIONS

Ali M. Khounsary, "A novel monochromator for high heat load synchrotron x-ray radiation", Rev. Sci. Instrum. 63(1), Jan. 1992, pp. 461–464.
P. L. Cowan et al., "Self-filtering crystal monochromators for synchrotron x radiation", Rev. Sci. Instrum. 60(7), Jul. 1989, pp. 1987–1990.
R. C. Evans et al., "A 'Parallel-Beam' Concentrating Monochromator for X-Rays", Acta Cryst. (1948) 1, pp. 124–129.
Jaromir Hrdý$^{a)}$, "Double crystal monochromator for synchrotron radiation with decreased radiation power density", Rev. Sci. Instrum. 63(1), Jan. 1992, pp. 459–460.

Primary Examiner—David P. Porta
Assistant Examiner—Don Wong
Attorney, Agent, or Firm—Daniel D. Park; Thomas G. Anderson; William R. Moser

[57] ABSTRACT

A double crystal monochromator including two identical, parallel crystals, each of which is cut such that the normal to the diffraction planes of interest makes an angle less than 90 degrees with the surface normal. Diffraction is symmetric, regardless of whether the crystals are symmetrically or asymmetrically cut, enabling operation of the monochromator with a fixed plane of diffraction. As a result of the inclination of the crystal surface, an incident beam has a footprint area which is elongated both vertically and horizontally when compared to that of the conventional monochromator, reducing the heat flux of the incident beam and enabling more efficient surface cooling. Because after inclination of the crystal only a fraction of thermal distortion lies in the diffraction plane, slope errors and the resultant misorientation of the diffracted beam are reduced.

3 Claims, 7 Drawing Sheets

INCLINED MONOCHROMATOR FOR HIGH HEAT-LOAD SYNCHROTRON X-RAY RADIATION

CONTRACTUAL ORIGIN OF THE INVENTION

The United States Government has rights in this invention pursuant to Contract No. W-31-109-ENG-38 between the U.S. Department of Energy and the University of Chicago.

BACKGROUND OF THE INVENTION

This invention relates to an improved monochromator, and in particular, to a double crystal monochromator in which the surface plane of each of two crystal blocks is inclined with respect to diffraction planes of interest, and more particularly, in which each of two single crystals is cut such that the normal to the diffraction planes of interest makes an angle close to but less than 90 degrees with the crystal surface normal.

The high heat load associated with the powerful and concentrated x-ray beams generated by insertion devices in synchrotron radiation facilities is a very significant factor in the design of monochromators and other optical devices. For example, the undulator source on the Advanced Photon Source ring under construction at Argonne National Laboratory will generate up to 10,000 W of heat on an approximately 1 cm$^2$ area of the first optics located approximately 24 m from the source. Peak normal flux will be as high as 500 W/mm$^2$.

For x-ray beams with low to moderate total power and power density, the first of double crystal monochromators may be cooled to reduce the thermal distortions, for example, by pumping a coolant (e.g., water) through appropriately configured cooling channels in the crystal.

The combination of high total power and very high power density found in high power undulator beams is such that conventional cooling of the first crystal as described above is not sufficient to reduce to acceptable levels the high temperatures and resulting thermal strain and stress.

A number of monochromator system designs have been suggested. Broadly categorized, the purposes of these designs are: (a) to reduce the incident power on the first crystal, (b) to reduce the heat flux on the crystal, and (c) to reduce the undesirable misorientation of the diffracted beam due to thermal distortion in the diffraction planes.

Monochromators of type (a) above which are designed to reduce the power of the incident beam may, for example, use filters of the absorbing type (e.g., carbon filters) or use the reflecting properties of a mirror and/or the diffracting properties of a crystal. A transmission x-ray mirror will reflect unwanted low-energy photons while transmitting the desired x-ray pass energy along with all other x rays above the mirror's cutoff energy. (See further, Cowan et al., "Self-Filtering Crystal Monochromators for Synchrotron X Radiation", *Rev.Sci.Instrum.* (1989) 60(7), 1987).

One way to accomplish purpose (b) above, reducing the heat flux on the crystal, is to increase the area of the beam footprint on the crystal surface by using an asymmetrically cut crystal in which the Bragg diffracting crystal planes are no longer parallel to the surface of the crystal, but make an angle ("cut angle") with the surface. Because the angle of incidence and the angle of exit relative to the surface are unequal, diffraction is also said to be asymmetric. Cutting an asymmetric crystal such that the angle of the diffracting planes relative to the surface is slightly less than the Bragg angle will make the angle of incidence small and the resultant footprint area of the beam on the surface relatively large. (See further, Evans et al., "A 'Parallel-Beam' Concentrating Monochromator for X-Rays," *Acta Cryst.*, 1,124, 1948). However, the range in which the monochromator may be tuned is then restricted because the beam must impinge at angles larger than the critical angle for total reflection, where a crystal acts more or less as a mirror. It is possible to tune such a monochromator, however, by rotating the crystal around the surface normal. One disadvantage here is that the position of the footprint on the crystal changes, which, for example, complicates the task of cooling the crystal.

The inclined monochromator of the present invention avoids the problems of asymmetric diffraction while successfully achieving both purposes (b) and (c) above. In addition, it can utilize thermal filters referred to above in (a).

In the inclined monochromator, crystal blocks are cut such that the normal to the diffraction planes of interest makes a prescribed "inclination" angle with the crystal surface normal. For the inclined crystal, both the incident and diffracted beams make the same angle with respect to the surface normal, and, therefore, diffraction is symmetric. Because of the multiplicity of diffraction planes in a crystal, a conventional (symmetrically cut) crystal may be inclined from its conventional setup for the same effect although one is restricted to only a few preset inclination angles. In such cases, diffraction is symmetric regardless of whether the crystal is symmetrically or asymmetrically cut. For example, in a symmetrically cut (111) silcon crystal, there are other (111) planes that are at 70.5 inclination angle with respect to the surface.

The advantages of the inclined monochromator are significant. Using the inclined monochromator the incident beam is spread both vertically and horizontally on the first crystal, providing a larger footprint area and thus reduced heat flux when compared to the conventional monochromator. Because the planes of diffraction are chosen apriori, the monochromator can be operated in a manner identical to that for the conventional monochromator, and the tuning range is practically similar to that of a conventional crystal; Bragg angles at high energies become quite small in both cases, but the critical angle for total external reflection is not reached. An additional, overriding advantage of the inclined monochromator for high heat load applications is that because there is an angle between the surface normal and the diffraction planes only a fraction of the thermal distortion will lie in the diffraction planes, significantly reducing undesirable misorientation of the diffracting planes and thus the diffracting rays from the first crystal of the double-crystal monochromator system.

It is therefore a primary object of this invention to provide a crystal monochromator which under the high heat load associated with recently developed and developing x-ray beams has an acceptable and optimal performance, as measured by the fraction of photons in the desired energy bandwidth that is diffracted from the double-crystal monochromator system and reaches the users' sample.

In the accomplishment of the foregoing object, it is another important object of this invention to provide a monochromator which may be operated with a fixed plane of symmetric diffraction, without sacrificing tunability.

It is another important object of this invention to provide a monochromator which when compared to the conventional monochromator decreases the incident heat flux of the beam by spreading it over a greater area of the crystal surface.

It is a further object of this invention to present a crystal monochromator in which undesirable misorientation of the diffracted rays from the first crystal is reduced by reducing thermal distortion in the diffraction planes.

A yet further object of the present invention is to present an inclined diffraction crystal which provides for a more efficient cooling by spreading the footprint of the incident beam horizontally, so that the footprint becomes very elongated and narrow, and easily cooled, a significant advantage particularly for cryogenic cooling.

Additional objects, advantages and novel features of the invention will become apparent to those skilled in the art upon examination of the following and by practice of the invention.

SUMMARY OF THE INVENTION

To achieve the foregoing and other objects, this invention comprises a double crystal monochromator including two identical, parallel crystals, each of which is cut such that the normal to the diffraction planes of interest makes an angle close to but less than 90 degrees with the surface normal. Diffraction is symmetric, regardless of whether the crystals are symmetrically or asymmetrically cut, enabling operation of the monochromator with a fixed plane of diffraction. As a result of the inclination of the crystal surface, an incident beam has a footprint area which is elongated horizontally when compared to that of the conventional monochromator, reducing the heat flux of the incident beam and enabling more efficient cooling. Because after inclination of the crystal only a fraction of thermal distortion lies in the diffraction plane of interest, slope errors and the resultant misorientation of the diffracted rays from the first crystal are substantially reduced.

BRIEF DESCRIPTION OF THE DRAWINGS

The present invention is illustrated in the accompanying drawings where:

FIGS. 1a, 1b, and 1c are schematic drawings of diffraction crystals.

DETAILED DESCRIPTION OF THE INVENTION

Figure 1A:
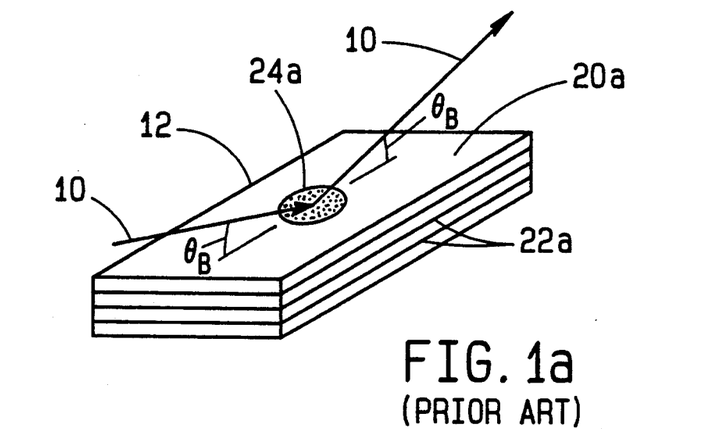
FIG. 1a depicts a crystal which has been symmetrically cut.

Depicted in FIG. 1a is a conventional diffracting single crystal 12 which has been symmetrically cut so that diffraction planes 22a are parallel to crystal surface 20a. Assuming that at angle $\theta_B$ the Bragg condition is satisfied, monochromatic x-ray beam 10 is symmetrically diffracted by crystallographic planes 22a. Assuming that beam 10 has a circular footprint in the plane normal to the direction of beam 10, then the footprint 24a of beam 10 on surface 20a will be oval. Because the incident beam 10 and the diffracted beam 10 make the same angle with respect to the surface normal, diffraction is symmetric.

Figure 1B:
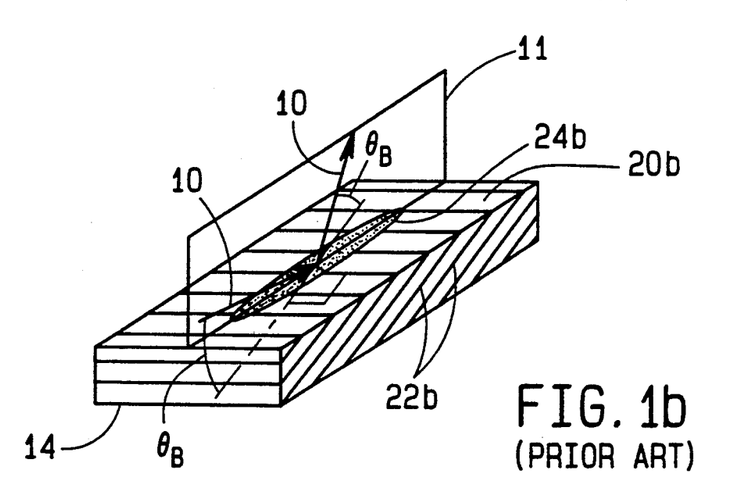
FIG. 1b depicts a crystal which has been asymmetrically cut.

Crystal 14 of FIG. 1b has been asymmetrically cut so that when compared to the conventional crystal the surface 20b is rotated about an axis which is normal to the scattering plane 11 which contains the incident beam 10 and diffracted beam 10. Again assuming that at angle $\theta_B$ the Bragg condition is satisfied, beam 10 is diffracted by planes 22b. Footprint 24b of beam 10 on surface 20b will be oval, and more elongated in the direction of beam 10 than footprint 24a. Because the incident beam 10 and the diffracted beam make unequal angles with respect to the surface normal, diffraction is asymmetric.

Figure 1C:
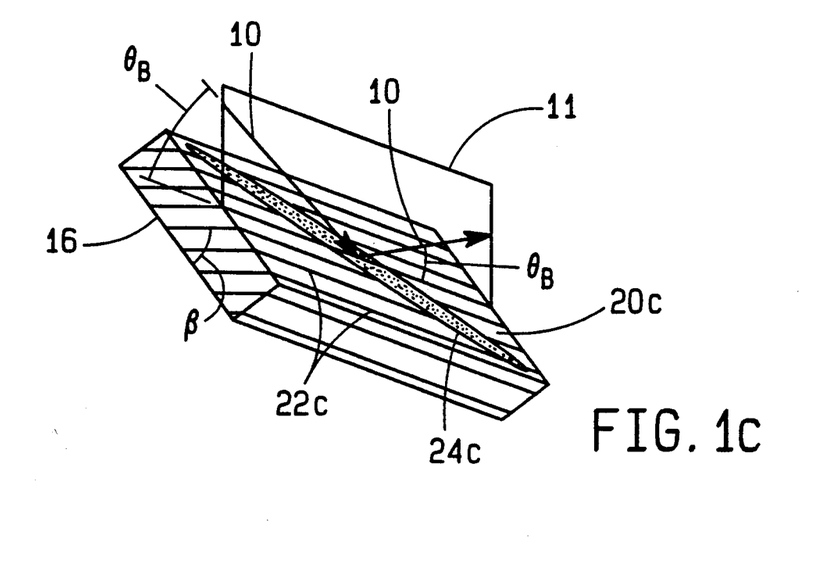
FIG. 1c depicts a crystal which has been inclined according to the present invention.

FIG. 1c exemplifies the principles of the present invention. Crystal 16 has been cut so that the normal to the diffraction planes 22c makes an angle close to but less than 90 degrees with the normal to crystal surface 20c. Again assuming that at angle $\theta_B$ the Bragg condition is satisfied, beam 10 is diffracted by planes 22c. Footprint 24c of beam 10 on surface 20c is spread both in the direction of the beam and horizontally.

Figure 2A:
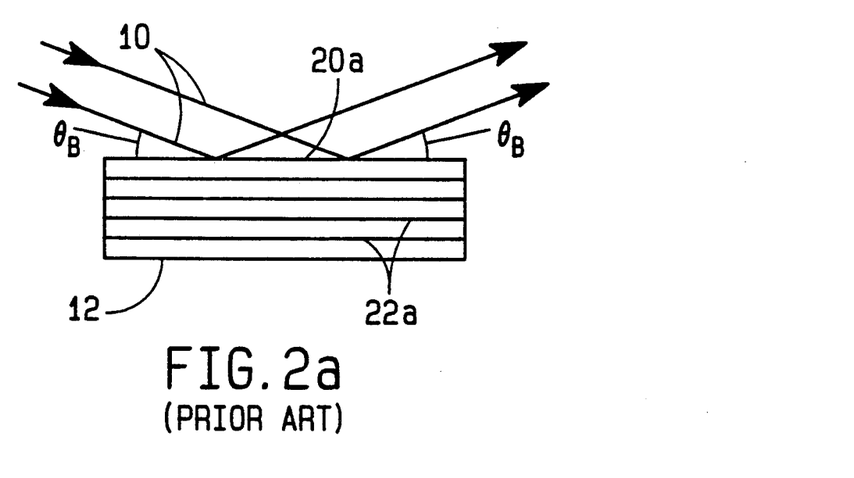
FIGS. 2a, 2b, and 2c are schematic drawings depicting beams which are incident upon and diffracted by the Bragg diffraction planes of the crystals in FIGS. 1a, 1b, and 1c, respectively.
Figure 2B:
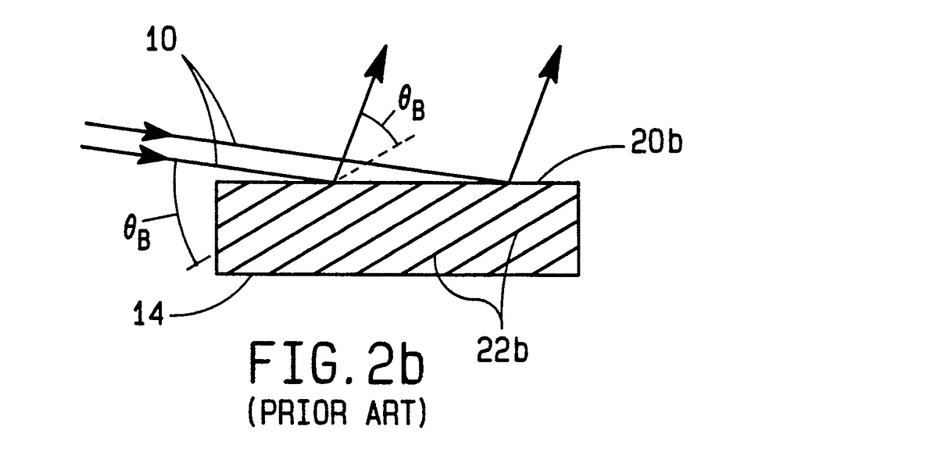
Figure 2C:
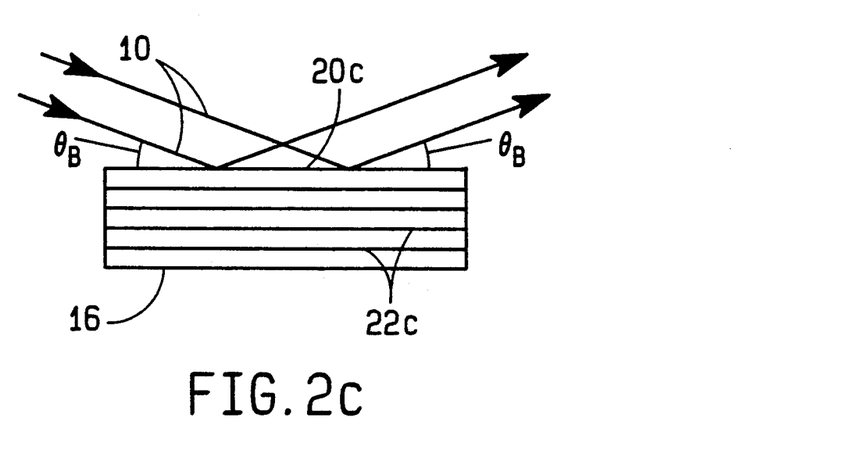

FIGS. 2a, 2b, and 2c are schematic drawings depicting beams which are incident upon and diffracted by the Bragg diffraction planes of the crystals in FIGS. 1a, 1b, and 1c, respectively.

In each of FIGS. 2a, 2b and 2c, beam 10 is incident upon the diffraction planes at angle $\theta_B$ to diffract photons of the desired energy. In the symmetrically cut crystal 12 of FIG. 2a, crystal surface 20a is parallel to diffraction planes 22a. In asymmetrically cut crystal 14 of FIG. 2b, crystal surface 20b is rotated about an axis which is normal to the scattering plane 11 shown in FIG. 1b. In the symmetrically cut crystal 16 of FIG. 2c, crystal surface 20c has been rotated so that the normal to the diffraction planes 22c makes an angle close to but less than 90 degrees with the normal to crystal surface 20c.

Figure 3:
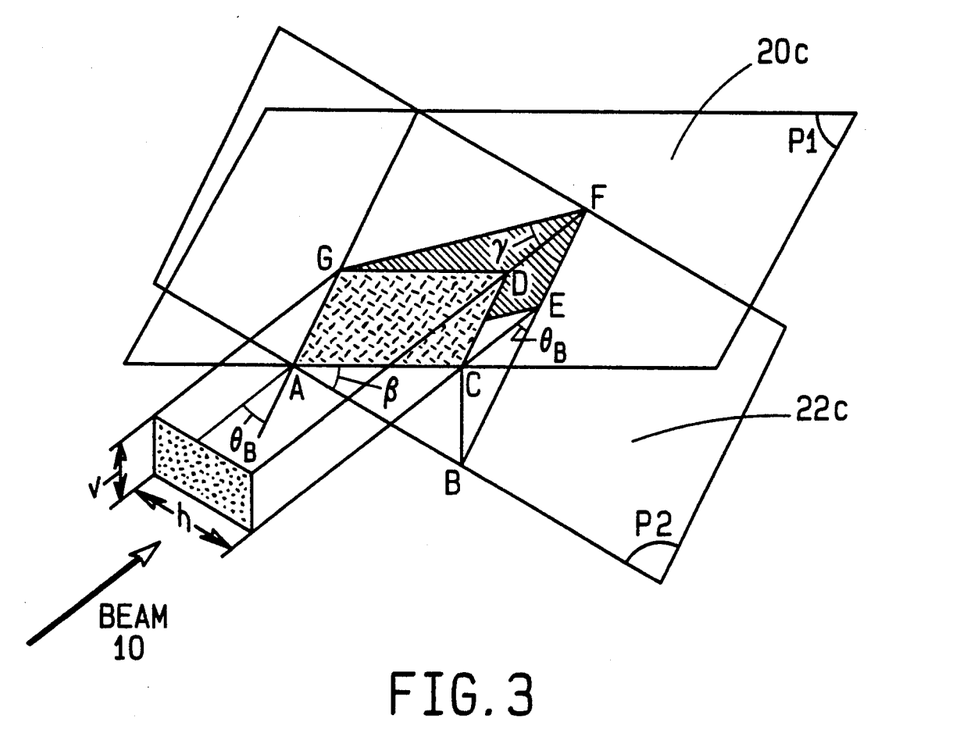
FIG. 3 depicts the normal footprint of an incident beam and its footprints on both a conventional and an inclined crystal.

The extent to which the horizontal dimension of the footprint is increased by use of the inclined crystal can be calculated. As shown in FIG. 3, beam 10 is incident at an angle $\theta_B$ on the surface of the inclined crystal represented by the dark shade on plane 22c. The crystallographic planes of interest are at an angle $\beta$ with respect to the surface of the crystal, and are parallel to the plane 20c, as shown. (In the crystal of FIG. 1a, planes 20c and 22c coincide and $\beta = 0$.)

Assume that at normal incidence, beam 10 has a rectangular footprint, and the height (in the vertical) and width (in the horizontal) of the footprint are v and h unit lengths respectively. If the beam is incident at a Bragg angle $\theta_B$, the beam footprint on a conventional crystal (shown by the lightly shaded area in the horizontal plane 20c in FIG. 3) is increased by a factor of $1/\sin \theta_B$. This is due to the spread in the vertical dimension of the beam.

The beam footprint on the surface of the inclined plane (represented in FIG. 3 by the plane 22c) making an angle $\beta$ with plane 20c is a parallelogram. The height of the beam footprint is identical to that of the conventional crystal and equal to $v/\sin \theta_B$. Referring now to FIG. 3, the width of the footprint is evaluated as follows:

$$AG = EF = CD = v/\sin \theta_B \tag{1}$$

$$\triangle ABC: AB = h/\cos \beta; \; BC = h \tan \beta \tag{2a)(2b}$$

$$\triangle BCE: BE = BC/\tan \theta_B = h \tan \beta / \tan \theta_B \tag{2c}$$

$$\triangle ABE: AE = (h/\cos \beta) \sqrt{[1 + (\sin \beta/\tan \theta_B)^2]} \tag{2d}$$

such that $$\sin \gamma = 1/\sqrt{[1 + (\sin \beta/\tan \theta_B)^2]} \tag{3}$$

The area of the inclined footprint is then $$Area = (AG)(AE) \sin \gamma = vh/(\sin \theta_B \cos \beta) \tag{4}$$

Therefore, in comparison with the conventional crystal, area of the beam footprint is increased by a factor of $1/\cos \beta$, or by a factor of $1/\sin \theta_B \cos \beta$ as compared with the normal incidence footprint.

Figure 4:
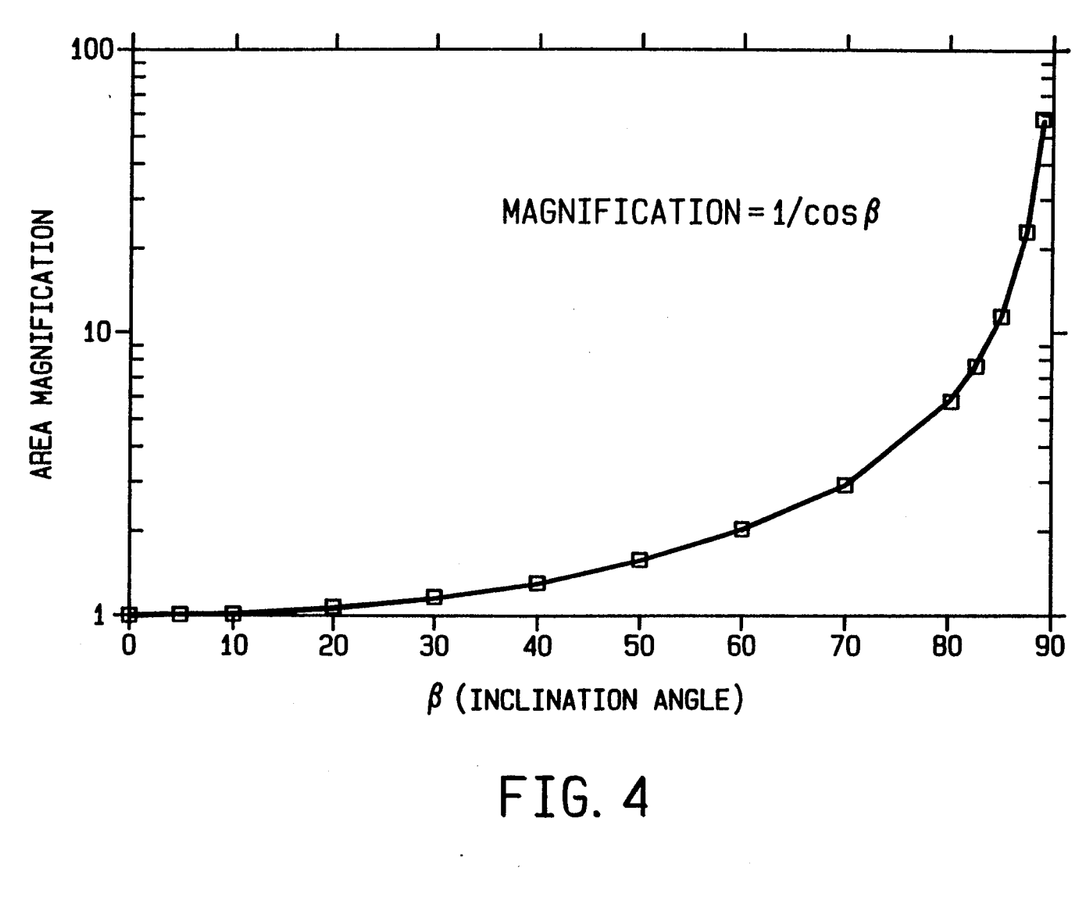
FIG. 4 plots magnification of an incident beam footprint on an inclined crystal as compared to the incident beam footprint on a conventional crystal as a function of the inclination angle $\beta$.

FIG. 4 plots magnification of an incident beam footprint on an inclined crystal as compared to the incident beam footprint on a conventional crystal as a function of the inclination angle $\beta$. It is seen, for example, that for an inclination angle of 85 degrees the area of the footprint is increased by a factor of 10 compared to the area of the normal incident footprint on a conventional crystal. Thus the incident flux is reduced by a factor of 10.

The inclination angle $\beta$ may have any value in the range $90° > \beta \geq 0°$. As one gets closer to 90°, the footprint of the beam will get larger and larger. The monochromator size will then be large. The size and quality of available single crystal blocks are thus two determinant factors in choosing the inclination angle $\beta$. However, since the powerful x-ray beams generated by undulators have very small sizes, the crystal size necessary to intercept the beam is reasonable. Furthermore, slits can be used to let only the central part of the x-ray beam hit the crystal.

There is an additional consideration with regard to the inclination angle. For a given material, in this case a single crystal, the angle that an x-ray beam makes with the surface must remain above some critical angle $\alpha_c$ to avoid total reflection, which is calculated as follows.

In the inclined geometry, the angle $\phi$ that an incident beam makes with the surface of a single crystal monochromator is given by $$\sin \phi = \sin \theta_B \cos \beta \tag{6}$$

where $\theta_B$ is the Bragg angle and $\beta$ is the inclination angle. The angle $\phi$ must remain larger than critical angle $\alpha_c$ to avoid total reflection. The critical angle for total reflection (see W. B. Yun and J. M. Bloch, "X-ray near total external fluorescence method: Experimental and analysis," J. Appl. Phys. 68(4), 1990) is approximately $$\alpha_c = \sqrt{2\delta} \tag{7}$$

where $(1-\delta)$ is the real part of the index of refraction of the material, and $$\delta = \frac{r_e \lambda^2 CF}{2\pi} \tag{8}$$

where $r_e$ is the classical electron radius, C is the number of molecules per unit volume, F is the number of electrons per molecule, and $\lambda$ is the incident x-ray wavelength.

From Equations 6–8, the condition for total reflection is $$\sin \phi \leq \sin \alpha_c \tag{9}$$

where $$\alpha_c = \lambda \sqrt{\left(\frac{r_e CF}{\pi}\right)} \tag{9a}$$

If the monochromator is to be used in the Bragg regime, then the Bragg equation given by $$\lambda = 2d \sin \theta_B \tag{10}$$

must also apply. In Eqn. 10, d is the diffracting plane lattice spacing, $\lambda$ is the wavelength and $\theta_B$ is the Bragg angle. Substituting for Sin $\theta_B$ from Eqn. 10 into Eqns. 6, we have:

$$\frac{\lambda}{2d} \cos \beta_c = \sin \alpha_c \tag{11}$$

where $\beta_c$ is defined as the critical inclination angle. A crystal cut at smaller inclination angles than $\beta_c$ avoids total reflection at all wavelengths.

Substituting for small angles $\alpha_c$ from Eqns. 7–8 in Eqn. 11, one gets $$\beta_c = \cos^{-1}\left\{ 2d \left[\frac{r_e CF}{\pi}\right]^{\frac{1}{2}} \right\} \tag{12}$$

For Si(111), Equation 12 gives $\beta_c = 89.1°$. For Ge(111) and diamond (400), the critical inclination angles are 88.7° and 89.71° respectively.

Figure 5:
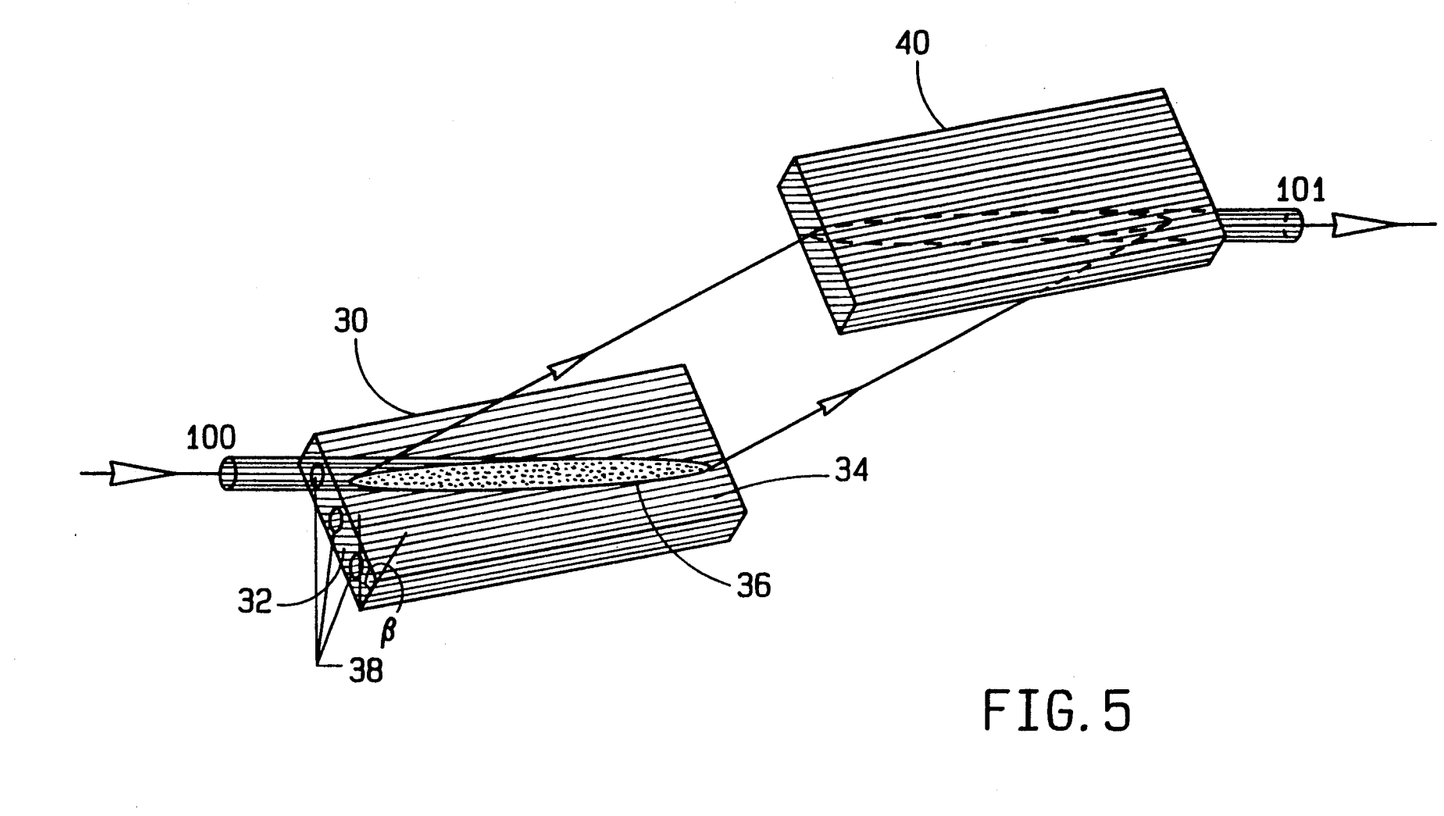
FIG. 5 is a schematic drawing depicting a double crystal monochromator of the present invention.

FIG. 5 is a schematic drawing of a double crystal monochromator of the present invention. In first crystal 30, plane 32 is inclined at angle $\beta$ to surface 34. Beam 100 is incident upon crystal 30, forming footprint 36, and is diffracted from planes parallel to plane 32. Cooling channels 38 provide means for cooling crystal 30. A second crystal 40 identical to crystal 30 positioned in parallel with crystal 30 will recollect beam 10, and diffract it in a direction parallel to the incident beam 100.

An additional advantage of the inclined crystal of the present invention is that thermal distortions are not as detrimental as in the case of conventional single-crystal monochromators. Because of the orientation of the diffraction planes with respect to the surface of the crystal, thermal distortion of the surface contributes only partially to the misorientation and thus the slope errors of the diffraction planes. In first crystal 30 of FIG. 5, a pure bending of the crystal along its horizontal dimension (i.e., width of the crystal 34) will not affect the Bragg angle $\theta_B$. For the bending along the length of the crystal, consider the case of $\beta$ approaching 90 degrees. There is only a minor change in the Bragg angle $\theta_B$ as a result of this bend (which can be thought of as a major component of the thermal distortion in the crystal) because to a first approximate the crystal diffraction planes remain almost parallel. Now, as the inclination angle is decreased from 90 degrees to 0 degrees (as in conventional monochromators), the effect of such a bend will become progressively more pronounced. From this point of view the conventional monochromator is the worst choice.

An additional advantage of the invention is that the spreading of the beam over a large surface area makes a several kill cryogenically cooled monochromator system feasible and more practical by (a) requiring far fewer vertical layers of cooling channels to provide the needed surface area for heat removal, thereby reducing the complexity of the design, (b) making the critical heat flux problem more manageable, (c) providing a more uniform temperature field on the surface of the crystal and thus more efficient cooling, and (d) producing a lower overall temperature in the system leading to better cooling efficiency, reduced thermal strains, and more managable thermal cycling of the system.

Figure 6:
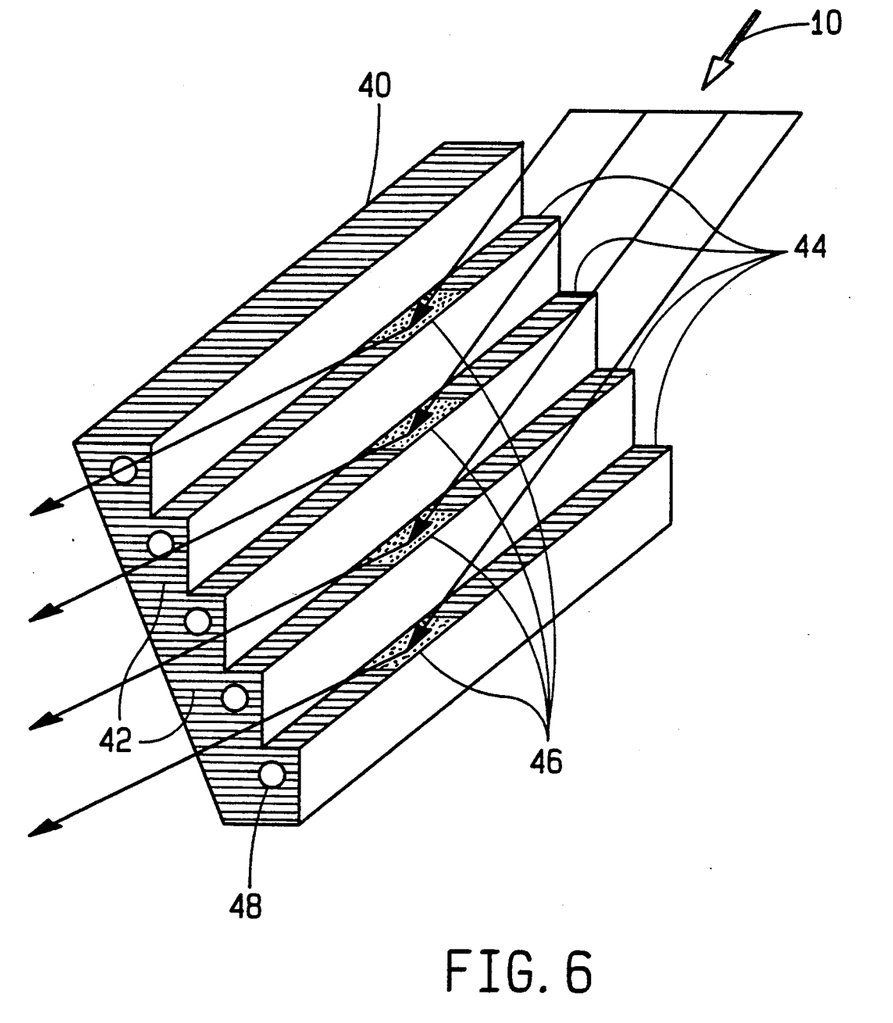
FIG. 6 is a schematic drawing depicting an alternate embodiment of an inclined crystal of the present invention.

FIG. 6 is a schematic drawing depicting an alternate embodiment of an inclined crystal of the present invention. Crystal 40 is symmetrically cut so that diffraction planes 42 are parallel to each of many crystal surfaces 44. Surfaces 44 are cooled by cooling channels 48. Beam 10 is simultaneously incident upon surfaces 44, and footprint 46 is spread over each of the surfaces 44. Cooling through channels 48 is enhanced because of the break up of the powerful incident power or beam onto smaller, spatially separated footprints when compared to the conventional crystal.

Figure 7:
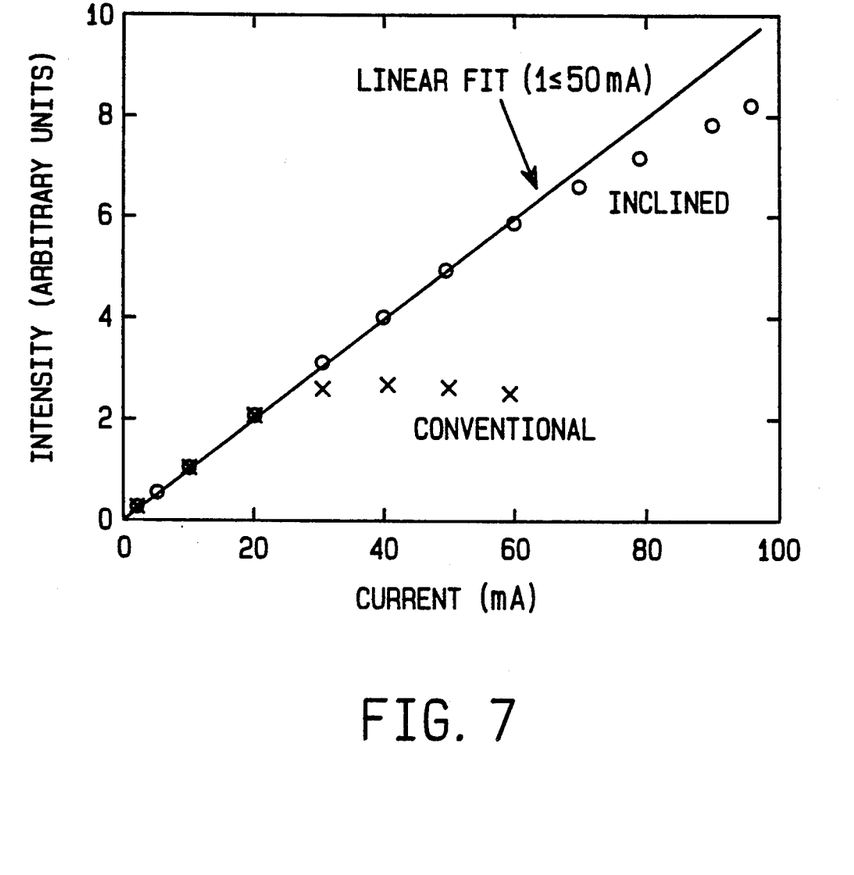
FIG. 7 is a graph depicting test results using the present invention.

FIG. 7 is a graph depicting test results using the present invention. Experiments were conducted at CHESS (Cornell High Energy Synchrotion Source) with the undulator placed in the Cornell electron storage ring (CSER). With CSER in dedicated operation at 5.433 GeV, the undulator first harmonic occurred at 5.14 keV with a gap of 1.7 cm. The first crystal in a double-crystal arrangement was placed 18 m from the undulator source. The dimensions of the incident beam in a plane 18 m from the source and transverse to direction of the beam in terms of the horizontal and vertical FWHM (full width and half maximum) are 4.6 mm and 2.0 mm respectively.

Calorimetric measurement of the incident beam at 49.4 mA ring current showed a value of 195 W for total power. It is estimated that the peak normal incident heat flux be about 50 W/mm$^2$.

Inclined crystal data in FIG. 7 was derived using the (111) reflection from a (111) silicon crystal. The value of $\beta$ for this case is 70.529 degrees. The crystal was symmetrically cut and measurements for both the inclined and conventional geometry were made with the same crystals (because there is a set of (111) planes at 70.529° with respect to the surface (111) planes). As shown in FIG. 7, the intensity of the beam diffracted from the inclined crystal measured in arbitrary units continued to increase even as currents approached 100 mA, indicating that the effects of increasing heat generation were negligible. (For a detailed analytical comparison of the performance of an inclined and a conventional monochromator, see Ali M. Khounsary, "A novel monochromater for high heat load synchrotron radiation," *Rev. Sci. Instrum.*, Vol. 63, No. 1, January 1992, which is incorporated herein by reference.)

The foregoing description of a preferred embodiment of the invention has been presented for purposes of illustration and description. It is not intended to be exhaustive or to limit the invention to the precise form disclosed, and obviously many modifications and variations are possible in light of the above teaching. The embodiments described explain the principles of the invention and practical applications and should enable others skilled in the art to utilize the invention in various embodiments and with various modifications as are suited to the particular use contemplated. It is intended that the scope of the invention be defined by the claims appended hereto.

The embodiments of this invention in which an exclusive property or privilege is claimed are defined as follows:

1. A method for increasing the area of the footprint of an incident beam on a diffraction crystal, comprising cutting said crystal such that the normal to the diffraction plane of interest makes an angle less than 90 degrees with the surface normal, and the incident and diffracted beams make the same angle with respect to the crystal surface normal.

2. A monochromator comprising a crystal wherein the normal to the diffraction planes within said crystal makes an angle less than 90 degrees with the surface normal of said crystal and incident and diffracted beams make the same angle with respect to the surface normal of said crystal.

3. The monochromator of claim 2 comprising at least two crystals positioned parallel to each other.

* * * * *